(12) United States Patent
Melchionni (10) Patent No.: US 12,057,187 B2
(45) Date of Patent: Aug. 6, 2024

(54) MASK ROM DEVICE

(71) Applicant: SK hynix Inc., Gyeonggi-do (KR)

(72) Inventor: Dario Melchionni, Agrate Brianza (IT)

(73) Assignee: SK hynix Inc., Gyeonggi-do (KR)

( * ) Notice: Subject to any disclaimer, the term of this patent is extended or adjusted under 35 U.S.C. 154(b) by 142 days.

(21) Appl. No.: 17/862,928

(22) Filed: Jul. 12, 2022

(65) Prior Publication Data

US 2023/0223055 A1    Jul. 13, 2023

(30) Foreign Application Priority Data

Jan. 12, 2022   (IT) ........................ 102022000000383

(51) Int. Cl.
| G11C 7/10 | (2006.01) |
| G11C 7/12 | (2006.01) |
| G11C 8/08 | (2006.01) |

(52) U.S. Cl.
CPC .......... G11C 7/1009 (2013.01); G11C 7/1069 (2013.01); G11C 7/12 (2013.01); G11C 8/08 (2013.01)

(58) Field of Classification Search
CPC ....... G11C 11/5692; G11C 17/12; G11C 7/10; G11C 5/025; G11C 5/06; G11C 7/1009; G11C 7/1069; G11C 7/12; G11C 8/08; H10B 20/34

See application file for complete search history.

(56) References Cited

U.S. PATENT DOCUMENTS

| 7,869,250 B2 | 1/2011 | Kato |
| 9,691,496 B1 | 6/2017 | Kohli et al. |
| 2005/0018465 A1* | 1/2005 | Jeung ................... G11C 17/126 |
| | | 365/94 |
| 2007/0127302 A1 | 6/2007 | Okamoto et al. |
| 2016/0172052 A1 | 6/2016 | Yang et al. |
| 2019/0080777 A1* | 3/2019 | Kohli .................. G11C 11/5692 |
| 2020/0066358 A1* | 2/2020 | Jeloka ................. G11C 11/4091 |

OTHER PUBLICATIONS

Search Report for Italian Patent Application No. 102022000000383 issued by the European Patent Office on Aug. 31, 2022.

* cited by examiner

*Primary Examiner* — Ajay Ojha
(74) *Attorney, Agent, or Firm* — IP & T GROUP LLP

(57) ABSTRACT

A mask read only memory device is provided. Single-transistor memory cells are arranged in rows and columns. Each word line is associated with a corresponding row. Each bit line is associated with a corresponding column. Each first reference line selectively provides a first potential in a first phase and a second potential in a second phase. Each second reference line selectively provides the second potential in the first read phase and the first potential in the second phase. Each memory cell has a gate coupled to a word line, a drain coupled to a bit line and a source terminal either floating, grounded or coupled to one among a first reference line and a second reference line. One of first to fourth logic values is read during a read operation of the memory cell.

9 Claims, 10 Drawing Sheets

MASK ROM DEVICE

CROSS-REFERENCE TO RELATED APPLICATION

The present application claims priority under 35 U.S.C. § 119(a) to Italian patent application number 102022000000383 filed on Jan. 12, 2022, the entire disclosure of which is incorporated by reference herein.

FIELD OF THE INVENTION

The present invention generally relates to the field of memory devices. Particularly, the present invention relates to a solid state memory device. More particularly, the present invention relates to an improved mask ROM ("Read Only Memory") device.

BACKGROUND OF THE INVENTION

ROM devices are memory devices capable of storing information, without any change, for the operating life thereof, i.e. without losing the stored information when a supply of electric power is shut off.

ROM devices are mainly classified into mask ROM devices and programmable ROM devices.

With particular reference to mask ROM devices, a mask ROM device is a memory device that is mask-programmed during manufacturing to store an unmodifiable set of data or program instructions.

A typical mask ROM device comprises a plurality of memory cells arranged in rows of memory cells and columns of memory cells, a plurality of word lines each one associated with a corresponding row of memory cells, and a plurality of bit lines each one associated with a corresponding column of memory cells, the memory cells being typically arranged at intersections between the word lines and the bit lines.

In a typical mask ROM device, the memory cells are programmable during manufacturing, to store in each one a logic value. A conventional memory cell, which is a single-transistor memory cell, typically comprises a MOS transistor e.g., a NMOS transistor, having a gate terminal electrically coupled to a respective word line, a source terminal and a drain terminal. A coupling state of the drain terminal or of the source terminal of the MOS transistor of each memory cell determines the logic value stored in the memory cell or, equivalently, the logic value at which the memory cell is programmed.

According to a known implementation, the drain terminal of the MOS transistor of the memory cell is electrically coupled to a respective bit line, and the source terminal of the MOS transistor of the memory cell may be either electrically floating, which corresponds to a first logic value e.g., logic value "0", being read during a read operation of that memory cell, or electrically coupled to a ground or earth line, which corresponds to a second logic value e.g., logic value "1", being read during the read operation of that memory cell. An electrical connect such as a contact and/or a via, is typically formed from the source terminal to a ground line through a plurality of dielectric and conductive layers therebetween, in order to achieve the corresponding electric coupling.

SUMMARY OF THE INVENTION

The conventional mask ROM devices are not satisfactory for applications that require high degree of integration and/or high amount of data to be stored.

This is essentially due to the fact that the logic values each memory cell is capable of storing are 1-bit logic values.

Furthermore, integrating the conventional mask ROM devices in memory systems may give rise to issues. Considering, just as an example, a memory system including both a mask ROM device and another type of memory device, such as a tridimensional ("3D") NAND flash memory device, mask ROM device programming significantly affects the manufacturing of the tridimensional NAND flash memory device.

For example, in a case that the memory cells of the mask ROM device are desired to be formed as a "Periphery Under Cell" (PUC) structure of the tridimensional NAND flash memory device, the mask ROM device programming and, particularly, the electrical connects to be formed throughout the memory system for providing the programming of the mask ROM device, may affect the manufacturing of the memory system.

The tridimensional NAND flash memory device typically results in large area electrical connects such as contacts and/or vias, which pose limiting layout constraints on manufacturing additional, dedicated electrical connects throughout the memory system to perform mask ROM device programming. This is not favorable in terms of area efficiency.

Moreover, mask ROM device programming and hence, a layout of the corresponding electrical connects to achieve it, actually depends on the information to be stored in the mask ROM device, thus the manufacturing of the tridimensional NAND flash memory system has to be adapted according to the layout of the electrical connects of the mask ROM device under it. This is not favorable in terms of manufacturing efficiency, in that the manufacturing of a same tridimensional NAND flash memory system may require several changes in the photomask set.

Furthermore, changes in mask ROM device programming at later manufacturing stages and, particularly, after manufacturing the tridimensional NAND flash memory system, are not allowed. This is also not favorable in terms of manufacturing efficiency, in that the possibility of correcting subsequently-found mask ROM device programming errors is excluded.

Also, mask ROM device layout is significantly affected by electrical disturbances generated by peripheral circuitry of the memory system: since PUC structure upper layers are typically used for power supply signals and noisy signals such as, clock signals, disturb-sensitive lines such as, the word lines and bit lines, are to be provided at PUC structure lower layers, whereby the electrical connects of the mask ROM device are necessary to be provided at the PUC structure upper layers.

To address the above-mentioned issues, and a mask ROM device has been devised, wherein each memory cell is capable of storing a 2-bit logic value and that can be easily integrated into memory systems.

One or more aspects of the present invention are set out in the independent claims, with advantageous features of the same invention that are indicated in the dependent claims, whose wording is enclosed herein verbatim by reference with any advantageous feature being provided with reference to a specific aspect of the present invention that applies mutatis mutandis to any other aspect.

More specifically, an aspect of the present invention relates to a mask read only memory device. The mask read only memory device comprises a plurality of single-transistor memory cells arranged in rows of memory cells and columns of memory cells. The mask read only memory device comprises a plurality of word lines each one associated with a corresponding row of memory cells of the plurality of memory cells. The mask read only memory device comprises a plurality of bit lines each one associated with a corresponding column of memory cells of the plurality of memory cells. The mask read only memory device comprises a ground line fixedly providing a ground electric potential. The mask read only memory device comprises a plurality of first reference lines each one selectively providing a first reference electric potential in a first read phase of a read operation, and a second reference electric potential higher than the first reference electric potential in a second read phase of the read operation. The mask read only memory device comprises a plurality of second reference lines each one selectively providing the second reference electric potential in the first read phase and the first reference electric potential in the second read phase. Each memory cell comprises a MOS transistor having a gate terminal electrically coupled to a respective word line, a drain terminal electrically coupled to a respective bit line, and a source terminal. The source terminal is either electrically floating or electrically coupled to one among a respective first reference line, a respective second reference line and the ground line, whereby a first logic value, a second logic value, a third logic value or a fourth logic value is respectively read during the read operation of that memory cell.

According to an embodiment, whose features may be additional or alternative to any previous features, at least one reference line among the plurality of first reference lines and the plurality of second reference lines is shared by adjacent columns of memory cells.

According to an embodiment, whose features may be additional or alternative to any previous features, each first reference line is shared by a respective first pair of adjacent columns of memory cells.

According to an embodiment, whose features may be additional or alternative to any previous features, each second reference line is shared by a respective second pair of adjacent columns of memory cells different from and adjacent to the first pair of adjacent columns of memory cells.

According to an embodiment, whose features may be additional or alternative to any previous features, the mask read only memory device comprises a bit line selection circuit for selecting bit lines associated with memory cells to be read during the read operation, the bit line selection circuit being configured to make each unselected bit line electrically floating during the read operation.

According to an embodiment, whose features may be additional or alternative to any previous features, the plurality of first reference lines and the plurality of second reference lines comprise a pair of first and second reference lines for each column of memory cells.

According to an embodiment, whose features may be additional or alternative to any previous features, the mask read only memory device comprises a driving arrangement for driving the plurality of first reference lines and the plurality of second reference lines with the first and second reference electric potentials.

According to an embodiment, whose features may be additional or alternative to any previous features, the driving arrangement comprises a CMOS inverter or a NMOS inverter.

According to an embodiment, whose features may be additional or alternative to any previous features, the first reference electric potential is the ground electric potential.

Another aspect of the present invention relates to a memory system comprising the mask read only memory device of above, or more thereof.

According to an embodiment, whose features may be additional or alternative to any previous features, the memory system comprises a tridimensional NAND flash memory device.

According to an embodiment, whose features may be additional or alternative to any previous features, the plurality of memory cells of the mask read only memory device form a periphery under cell structure of the tridimensional NAND flash memory device.

According to an embodiment, whose features may be additional or alternative to any previous features, at least one, preferably both, between the first and second reference lines is formed from an uppermost metal layer of the memory system.

According to an embodiment, whose features may be additional or alternative to any previous features, the source terminal of each MOS transistor is electrically coupled to one among the first reference line, the second reference line and the ground line by means of a respective electric coupling formed from the uppermost metal layer of the memory system.

A further aspect of the present invention relates to an electronic system comprising at least one between the mask read only memory device of above (or more thereof), and the memory system of above (or more thereof).

A further aspect of the present invention relates to a mask read only memory device. The mask read only memory device comprises an array of single-transistor memory cells each having a gate coupled to a word line and a drain coupled to a bit line, and a control circuit configured to perform a read operation of reading data from the array. The array is configured by at least one of first to fourth memory cells respectively having first to fourth sources and respectively representing first to fourth data. The first and second sources are coupled respectively to first and second reference lines. The third source is floated. The fourth source is grounded. The read operation includes applying operating voltages to the word line and the bit line, and applying first and second voltages, in a first phase, and then vice versa, in a second phase, to the respective first and second reference lines to check whether a current flows on the bit line in each of the first and second phases thereby identifying one of the first to fourth data.

BRIEF DESCRIPTION OF THE DRAWINGS

These and other features and advantages of the present invention will be made apparent by the following description of some non-limitative embodiments thereof; for better intelligibility, the following description should be read making reference to the attached drawings, wherein.

DETAILED DESCRIPTION

Figure 1A:
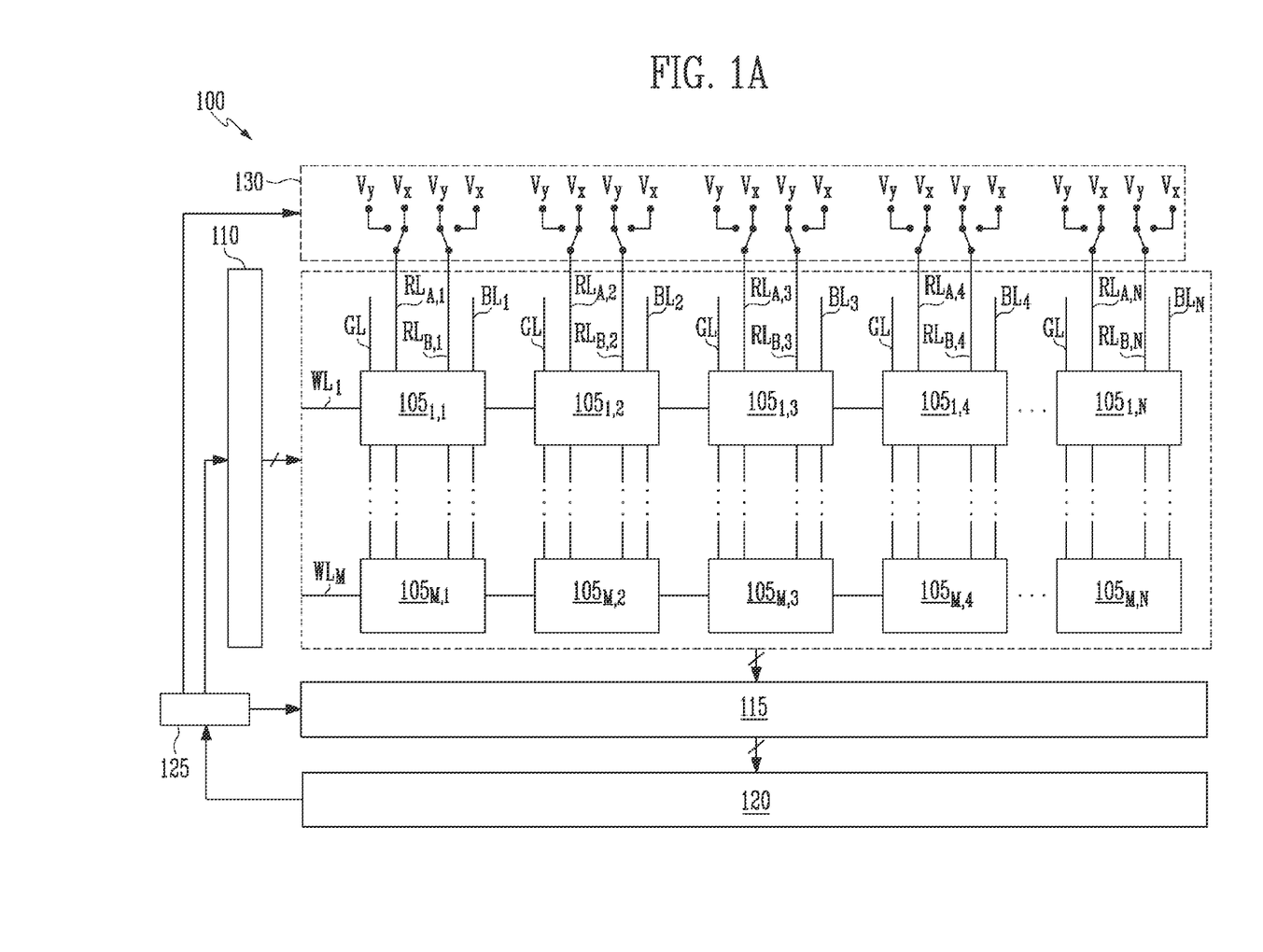
FIG. 1A schematically shows a mask ROM device according to an embodiment of the present invention.

FIG. 1A schematically shows, according to an embodiment of the present invention, a mask ROM ("Read Only Memory") device 100, i.e., a memory device that is mask-programmed during manufacturing to store an unmodifiable set of data or program instructions.

In the following, when one or more features are introduced by the wording "according to an embodiment", the features are to be construed as features additional or alternative to any features previously introduced, unless otherwise indicated and/or unless there is evident incompatibility among feature combinations.

In the following, only elements and operations deemed relevant for the understanding of the present invention will be shown and discussed, with other well-known elements and operations intentionally omitted for the sake of conciseness.

According to an embodiment, the mask ROM device 100 comprises a plurality of memory cells $105_{m,n}$ (m=1, 2, . . . , M, n=1, 2, . . . , N). According to an embodiment, the memory cells $105_{m,n}$ are programmable during manufacturing to store in each one a logic value among a plurality of logic values.

According to an embodiment, the memory cells $105_{m,n}$ are arranged in rows of memory cells and columns of memory cells, the row and column arrangement of the memory cells $105_{m,n}$ defining a memory matrix or memory array. According to an embodiment, the memory cells $105_{m,n}$ are arranged in M rows of memory cells and N columns of memory cells.

According to an embodiment, the mask ROM device 100 comprises a plurality of word lines $WL_m$ each one associated with a corresponding row of memory cells, and a plurality of bit lines $BL_n$ each one associated with a corresponding column of memory cells, the memory cells $105_{m,n}$ being for example arranged at intersections between the word lines $WL_m$ and the bit lines $BL_n$. just as an example, the memory cell $105_{1,1}$ is associated with i.e., it is arranged at the intersection of the word line $WL_1$ and the bit line $BL_1$, the memory cell $105_{1,2}$ is associated with i.e., it is arranged at the intersection of the word line $WL_1$ and the bit line $BL_2$, the memory cell $105_{1,3}$ is associated with i.e., it is arranged at the intersection of the word line $WL_1$ and the bit line $BL_3$, the memory cell $105_{1,4}$ is associated with i.e., it is arranged at the intersection of the word line $WL_1$ and the bit line $BL_4$, and the memory cell $105_{1,N}$ is associated with i.e., it is arranged at the intersection of the word line $WL_1$ and the bit line $BL_N$.

According to an embodiment, the mask ROM device 100 comprises a word line selection circuit 110 for selecting one or more word lines among the plurality of word lines $WL_m$ according to a row address.

According to an embodiment, the mask ROM device 100 comprises a bit line selection circuit 115 for selecting one or more bit lines among the plurality of bit lines $BL_n$ according to a column address.

According to an embodiment, each pair of selected word line and bit line identifies a corresponding selected memory cell of the plurality of memory cells $105_{m,n}$.

According to an embodiment, the mask ROM device 100 comprises a reading circuit 120 for reading the logic value of, i.e., stored in, the selected memory cell $105_{m,n}$.

According to an embodiment, the reading circuit 120 is configured to read the logic value of the selected memory cell $105_{m,n}$ according to an electric current flowing through the bit line $BL_n$ associated with the selected memory cell $105_{m,n}$.

According to an embodiment, the mask ROM device 100 comprises a control logic unit 125 configured to control an overall operation of the mask ROM device 100. As conceptually represented in the figure by respective arrow connections, the control logic unit 125 may be configured to provide the row address to the word line selection circuit 110, to provide the column address to the bit line selection circuit 115, to receive the logic value being read by the reading circuit 120, and to control a driving arrangement (discussed in the following).

According to an embodiment, the mask ROM device 100 comprises a ground line GL fixedly providing a ground (or earth) electric potential. According to an embodiment, as usual in electronic circuits, the ground electric potential may be set at 0 V.

According to an embodiment, the mask ROM device 100 comprises a plurality of reference lines $RL_{A,n}$. According to an embodiment, each reference line $RL_{A,n}$ is associated with a respective (n-th) column of memory cells. In this embodiment, the reference line $RL_{A,1}$ is associated with the column of memory cells $105_{1,1}$-$105_{M,1}$ (i.e., n=1), the reference line $RL_{A,2}$ is associated with the column of memory cells $105_{1,2}$-$105_{M,2}$ (i.e., n=2), the reference line $RL_{A,3}$ is associated with the column of memory cells $105_{1,3}$-$105_{M,3}$ (i.e., n=3), the reference line $RL_{A,4}$ is associated with the column of memory cells $105_{1,4}$-$105_{M,4}$ (i.e., n=4), and the reference line $RL_{A,N}$ is associated with the column of memory cells $105_{1,N}$-$105_{M,N}$ (i.e., n=N).

According to an embodiment, each reference line $RL_{A,n}$ selectively provides a first reference electric potential $V_x$ or a second reference electric potential $V_y$. According to an embodiment, the second reference electric potential $V_y$ is higher than the first reference electric potential $V_x$, which is a reason why the first $V_x$ and second $V_y$ reference electric potentials will be referred to as low $V_x$ and high $V_y$ electric potentials, respectively.

According to an embodiment, the low electric potential $V_x$ is equal or almost or substantially equal to the ground electric potential, as detailed in the following when discussing a driving arrangement of the mask ROM device 100.

According to an embodiment, the high electric potential $V_y$ is equal or almost equal to a power supply electric potential $V_{DD}$ supplying power to the mask ROM device 100, as detailed in the following when discussing the driving arrangement of the mask ROM device 100.

According to an embodiment, the mask ROM device 100 comprises a plurality of further reference lines $RL_{B,n}$. According to an embodiment, each reference line $RL_{B,n}$ is associated with a respective (n-th) column of memory cells. In this embodiment, the reference line $RL_{B,1}$ is associated with the column of memory cells $105_{1,1}$-$105_{M,1}$ (i.e., n=1), the reference line $RL_{B,2}$ is associated with the column of memory cells $105_{1,2}$-$105_{M,2}$ (i.e., n=2), the reference line $RL_{B,3}$ is associated with the column of memory cells $105_{1,3}$-$105_{M,3}$ (i.e., n=3), the reference line $RL_{B,4}$ is associated with the column of memory cells $105_{1,4}$-$105_{M,4}$ (i.e., n=4), and the reference line $RL_{B,N}$ is associated with the column of memory cells $105_{1,N}$-$105_{M,N}$ (i.e., n=N).

According to an embodiment, each reference line $RL_{B,n}$ selectively provides the low electric potential $V_x$ or the high electric potential $V_y$.

According to an embodiment, the mask ROM device 100 comprises a driving arrangement 130 for driving the reference lines $RL_{A,n}$, $RL_{B,n}$ with the low $V_x$ and high $V_y$ electric potentials.

According to an embodiment, the driving arrangement 130 is operated under the control of the control logic unit 125 as conceptually illustrated in the figure by arrow connection between the control logic unit 125 and the driving arrangement 130.

The driving arrangement 130 is conceptually represented in the figures as a switching arrangement selectively coupling each reference line $RL_{A,n}$, $RL_{B,n}$ to a reference electric terminal providing the low electric potential $V_x$ or to a reference electric terminal providing the high electric potential $V_y$. However, the practical implementation of the driving arrangement 130 is not limiting for the present invention.

Just as an example of a practical implementation, the driving arrangement 130 may comprise, for each reference line $RL_{A,n}$, $RL_{B,n}$, or for each group of reference lines $RL_{A,n}$, $RL_{B,n}$, a CMOS inverter PN1 and a CMOS buffer PN2 (shown in the left drawing of FIG. 1E), or other type of driver, each powered between the power supply electric potential $V_{DD}$ and the ground electric potential. The CMOS inverter PN1 has an output terminal electrically coupled to the reference line $RL_{A,n}$, and the CMOS buffer PN2 has an output terminal electrically coupled to the reference line $RL_{B,n}$. According to an embodiment, each CMOS inverter PN1 may be configured to selectively drive the reference line $RL_{A,n}$ with the ground electric potential or with the power supply electric potential according to a corresponding control signal S provided e.g., by the control logic unit 125, at an input terminal of the CMOS inverter PN1. According to an embodiment, each CMOS buffer PN2 may be configured to selectively drive the reference line $RL_{B,n}$ with the power supply electric potential or the ground electric potential according to the corresponding control signal S provided at an input terminal of the CMOS buffer PN2. In this practical implementation, the PMOS transistor which is electrically coupled to the power supply electric potential $V_{DD}$ of the CMOS inverter PN1 acts as pull-up transistor enabled by the low logic level of the control signal S, whereby the high electric potential $V_y$ is equal to the power supply electric potential $V_{DD}$. In this practical implementation, the NMOS transistor which is electrically coupled to the ground electric potential of the CMOS inverter PN1 acts as pull-down transistor enabled by the high logic level of the control signal S, whereby the low electric potential $V_x$ is equal to the ground electric potential. Similarly, the PMOS transistor which is electrically coupled to the power supply electric potential $V_{DD}$ of the CMOS buffer PN2 acts as pull-up transistor enabled by the low logic level of the control signal S, whereby the high electric potential $V_y$ is equal to the power supply electric potential $V_{DD}$. In this practical implementation, the NMOS transistor which is electrically coupled to the ground electric potential of the CMOS buffer PN2 acts as pull-down transistor enabled by the high logic level of the control signal S, whereby the low electric potential $V_x$ is equal to the ground electric potential.

Just as another example of a practical implementation, the driving arrangement 130 may comprise, for each reference line $RL_{A,n}$, $RL_{B,n}$, or for each group of reference lines $RL_{A,n}$, $RL_{B,n}$, a NMOS-NMOS inverter NN1 and a NMOS-NMOS buffer NN2 (shown in the right drawing of FIG. 1E), or other type of driver, each powered between the power supply electric potential $V_{DD}$ and the ground electric potential. The NMOS-NMOS inverter NN1 has an output terminal electrically coupled to the reference line $RL_{A,n}$ and the NMOS-NMOS buffer NN2 has an output terminal electrically coupled to the reference line $RL_{B,n}$. According to an embodiment, each NMOS-NMOS inverter NN1 comprises a NMOS transistor electrically coupled to the ground electric potential and acting as pull-down transistor enabled by a control signal S, and a NMOS transistor electrically coupled to the power supply electric potential $V_{DD}$ and acting as pull-up transistor enabled by a control signal $\overline{S}$. According to an embodiment, the control signal $\overline{S}$ is the negated version of the control signal S. According to an embodiment, each NMOS-NMOS inverter NN1 may be configured to selectively drive the reference line $RL_{A,n}$ with the ground electric potential (low logic level) or with the power supply electric potential $V_{DD}$ minus the threshold electric potential of the NMOS transistor (high logic level) according to the corresponding control signal S, $\overline{S}$ respectively provided e.g., by the control logic unit 125, at an input terminal e.g., the gate terminal, of the pull-down and pull-up transistors of the NMOS-NMOS inverter NN1.

In addition, each NMOS-NMOS buffer NN2 comprises a NMOS transistor electrically coupled to the ground electric potential and acting as pull-down transistor enabled by the control signal $\overline{S}$, and a NMOS transistor electrically coupled to the power supply electric potential $V_{DD}$ and acting as pull-up transistor enabled by the control signal S. According to an embodiment, each NMOS-NMOS buffer NN2 may be configured to selectively drive the reference line $RL_{B,n}$ with the power supply electric potential $V_{DD}$ minus the threshold electric potential of the NMOS transistor (high logic level) or with the ground electric potential (low logic level) according to the corresponding control signal S, $\overline{S}$ respectively provided at an input terminal e.g., the gate terminal, of the pull-down and pull-up transistors of the NMOS-NMOS buffer NN2.

In this practical implementation, the low electric potential $V_x$ is equal to the ground electric potential and the high electric potential $V_y$ is substantially equal to the power supply electric potential $V_{DD}$ i.e., the power supply electric potential minus the threshold electric potential. With respect to the CMOS inverter and the CMOS buffer implementation of the driving arrangement 130, the NMOS-NMOS inverter and the NMOS-NMOS buffer implementation of the driving arrangement 130 allows achieving a significant reduction in power consumption without impairing the read operation of the selected memory cell $105_{m,n}$. Also, compared to CMOS inverter and the CMOS buffer implementation of the driving arrangement 130, the NMOS-NMOS inverter and the NMOS-NMOS buffer implementation is more efficient in terms of area occupation in that no separated n-well is needed.

As better discussed in the following, during a read operation of a selected memory cell $105_{m,n}$, the corresponding reference line $RL_{A,n}$ provides the low electric potential $V_x$ in a first read phase of the read operation, and the high electric potential $V_y$ in a second read phase of the read operation, and the corresponding reference line $RL_{B,n}$ provides the high electric potential $V_y$ in the first read phase of the read operation and the low electric potential $V_x$ in the second read phase of the read operation. That is, considering the low electric potential $V_x$ as a low logic level ("0") and the high electric potential $V_y$ as a high logic level ("1"), during the read operation of the selected memory cell $105_{m,n}$ the corresponding reference lines $RL_{A,n}$, $RL_{B,n}$ are respectively set at the low and high logic levels in the first read phase, and at the high and low logic levels in the second read phase.

Figure 1B:
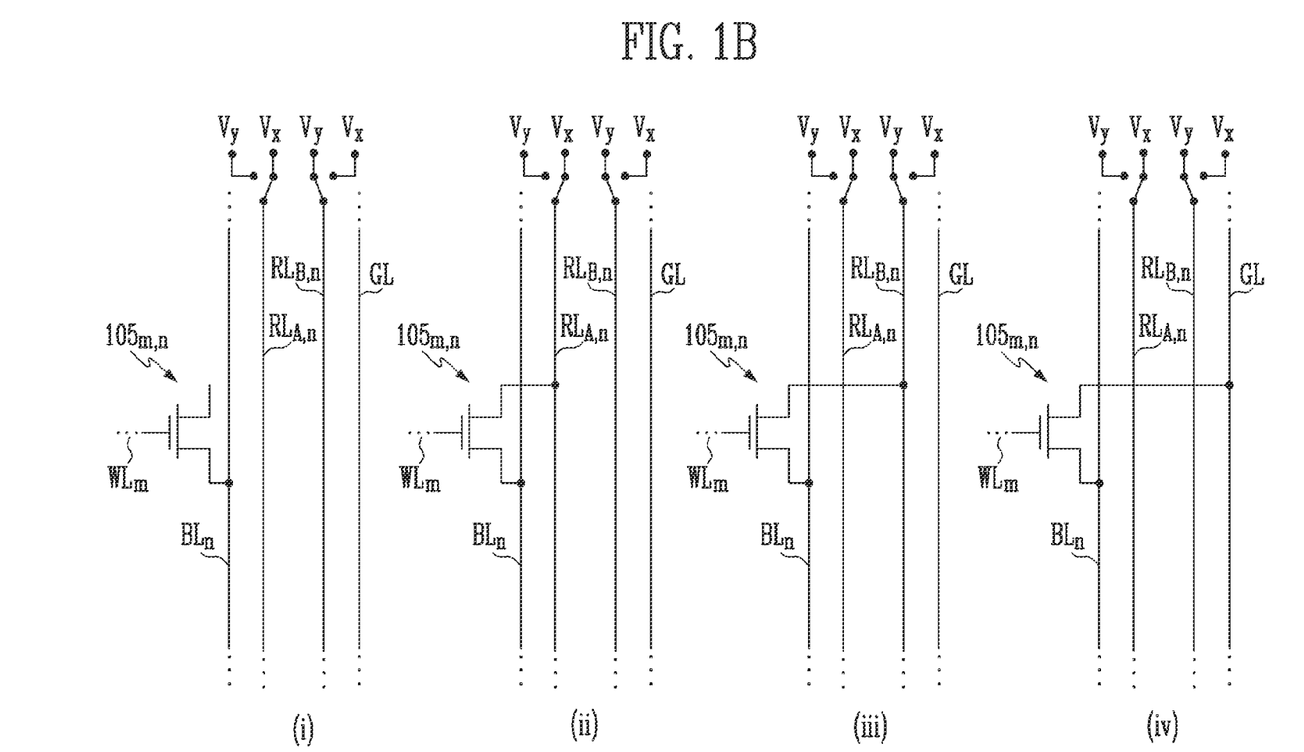
FIGS. 1B and 1C show a memory cell of the mask ROM device of FIG. 1A in first and second read phases, respectively, according to an embodiment of the present invention.
Figure 1C:
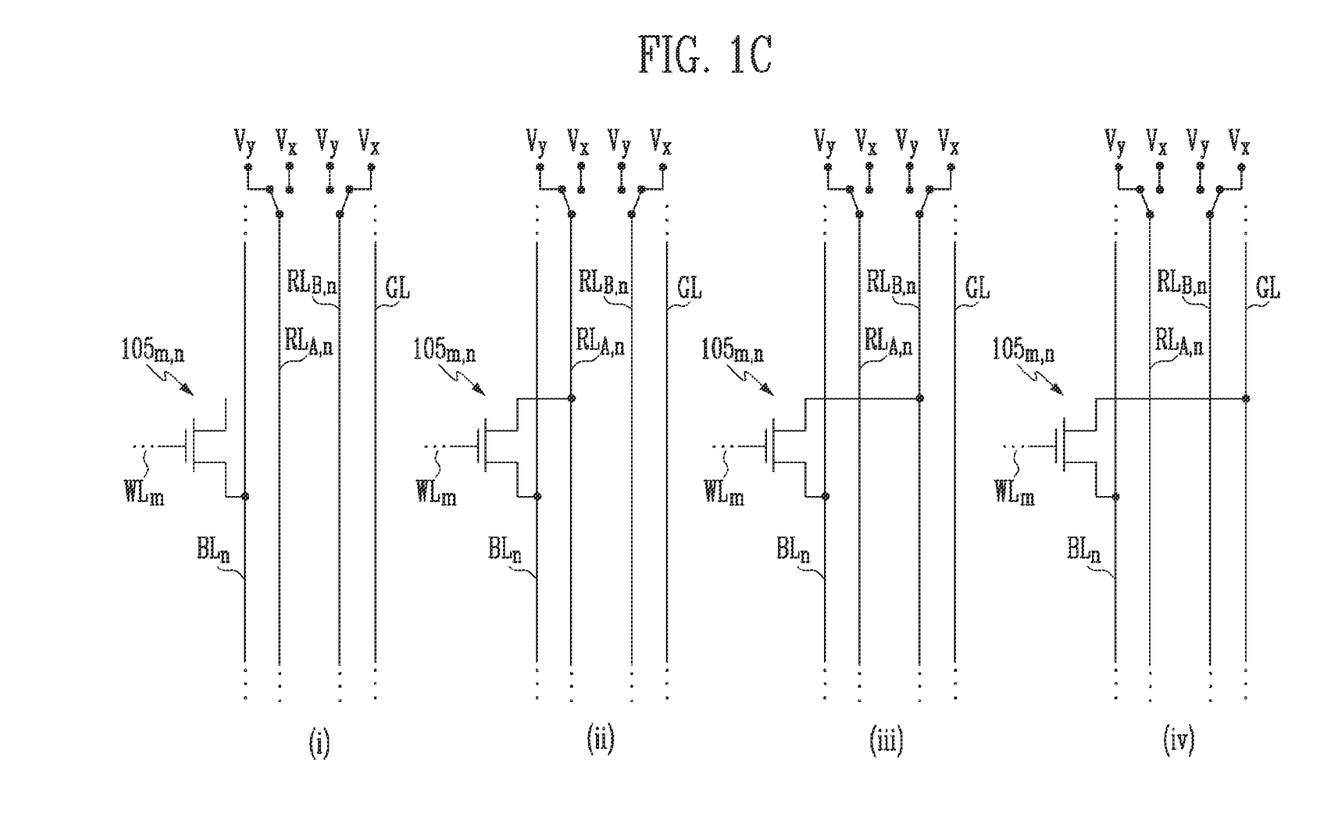

With reference also to FIGS. 1B and 1C, they show a memory cell $105_{m,n}$ of the mask ROM device 100 in the first and second read phases, respectively, according to an embodiment of the present invention.

According to an embodiment, each memory cell $105_{m,n}$ is a single-transistor memory cell.

According to an embodiment, each memory cell $105_{m,n}$ comprises a MOS transistor, e.g., a NMOS transistor, having a gate terminal electrically coupled with, e.g., electrically connected to, a respective word line $WL_m$, a drain terminal electrically coupled with, e.g., electrically connected to, a respective bit line $BL_n$, and a source terminal. As discussed here below, a (mask-programmed) coupling condition or coupling state of the source terminal of the MOS transistor of each memory cell $105_{m,n}$ determines the logic value stored in the memory cell $105_{m,n}$ or, equivalently, the logic value at which the memory cell $105_{m,n}$ is programmed. References (i) to (iv) in FIGS. 1B and 1C denote different and mutually alternative coupling states, which will be discussed here below.

According to an embodiment, the source terminal of the MOS transistor of the memory cell $105_{m,n}$ may be either electrically floating (coupling state (i)), or electrically coupled to one among the respective reference line $RL_{A,n}$ (coupling state (ii)), the respective reference line $RL_{B,n}$ (coupling state (iii)) and the ground line GL (coupling state (iv)), whereby a respective logic value is read during the read operation of that memory cell $105_{m,n}$. A selected MOS transistor may essentially experience a first conductive condition in which no electric current is allowed to flow through it such as, when the source terminal of the MOS transistor is electrically floating or when the source terminal of the MOS transistor receives the high electrical potential $V_y$, or a second conductive condition in which an electric current is allowed to flow through it such as, when the source terminal of the MOS transistor is electrically coupled to the ground line GL or when the source terminal of the MOS transistor receives the low electrical potential $V_x$. For the purposes of the present disclosure, the first and second conductive conditions of the selected MOS transistor are conventionally associated with the low and high logic levels, respectively, stored in the selected MOS transistor.

According to an embodiment, when the source terminal of the MOS transistor of the memory cell $105_{m,n}$ is electrically floating (coupling state (i)), the low logic level is read in both the first and second read phases, whereby the logic value "00" is read during the read operation of the memory cell $105_{m,n}$.

According to an embodiment, when the source terminal of the MOS transistor of the memory cell $105_{m,n}$ is electrically coupled to the reference line $RL_{A,n}$ (coupling state (ii)), in the example herein considered in which the low electric potential $V_x$ is provided in the first read phase to the reference line $RL_{A,n}$ (FIG. 1B) and the high electric potential $V_y$ is provided in the second read phase to the reference line $RL_{A,n}$ (FIG. 1C), the high logic level is read in the first read phase and the low logic level is read in the second read phase, whereby the logic value "10" is read during the read operation of that memory cell $105_{m,n}$.

According to an embodiment, when the source terminal of the MOS transistor of the memory cell $105_{m,n}$ is electrically coupled to the reference line $RL_{B,n}$ (coupling state (iii)), in the example herein considered in which the high electric potential $V_y$ is provided in the first read phase to the reference line $RL_{B,n}$ (FIG. 1B) and the low electric potential $V_x$ is provided in the second read phase to the reference line $RL_{B,n}$ (FIG. 1C), the low logic level is read in the first read phase and the high logic level is read in the second read phase, whereby the logic value "01" is read during the read operation of that memory cell $105_{m,n}$.

According to an embodiment, when the source terminal of the MOS transistor of the memory cell $105_{m,n}$ is electrically coupled to the ground line GL (coupling state (iv)), the high logic level is read in both the first and second read phases, whereby the logic value "11" is read during the read operation of that memory cell $105_{m,n}$.

Therefore, according to the present invention, each memory cell $105_{m,n}$ may store a 2-bit logic value namely, a logic value among the logic values "00", "01", "10" and "11", i.e. a logic value having a double number of bits with respect to the conventional mask ROM devices. This allows significantly reducing the size of the mask ROM device 100: indeed, for a same overall amount of data to be stored in the mask ROM device 100, a lower number particularly, a half of the memory cells $105_{m,n}$ is required, which decrees a reduction in the size of the memory array and in the number of word lines and/or bit lines as can be easily verified. The presence of the reference lines $RL_{A,n}$, $RL_{B,n}$ and of the driving arrangement 130 does not significantly affect the size reduction of the mask ROM device 100 provided by the reduction in the size of the memory array and in the number of word lines and/or bit lines.

Figure 1D:
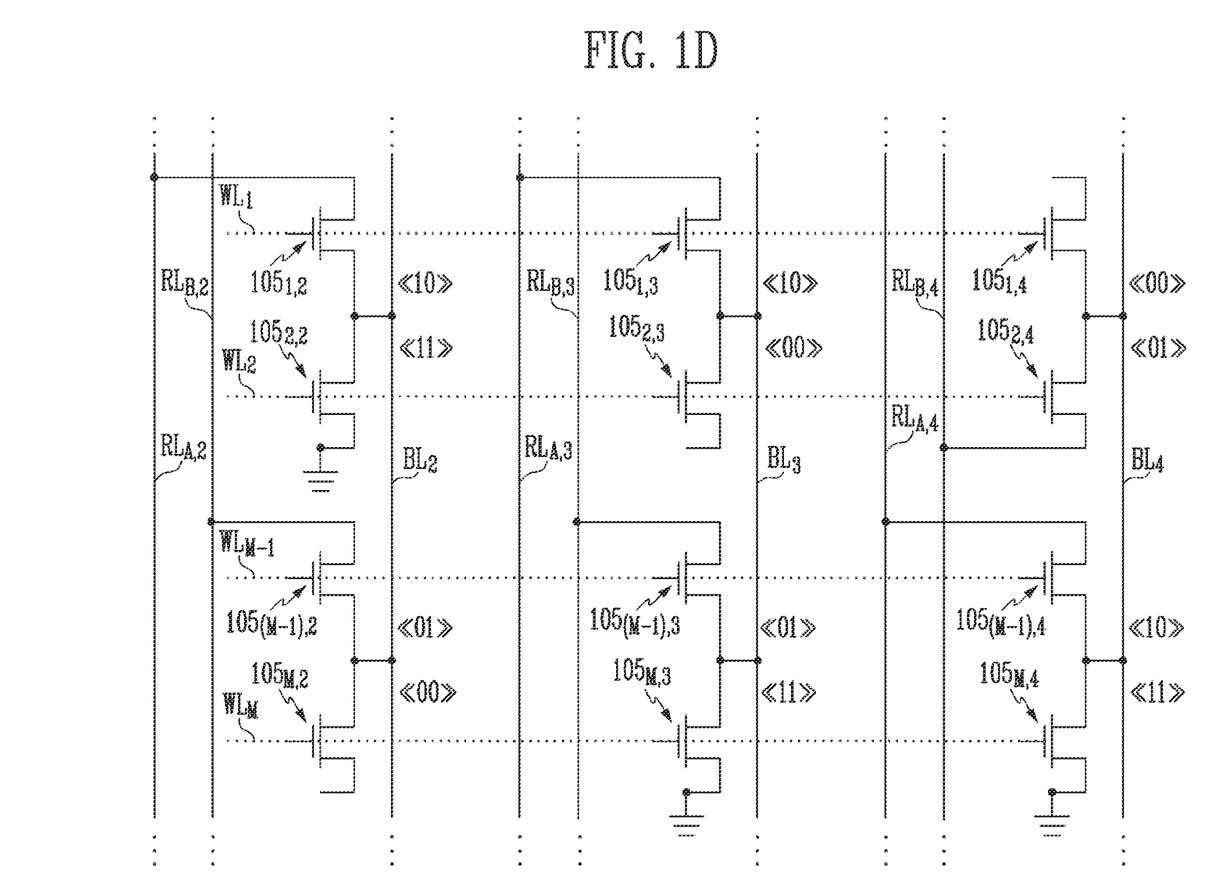
FIG. 1D shows a circuit diagram of a subset of the memory cells of the mask ROM device of FIG. 1A in coupling states, according to an embodiment of the present invention.
Figure 1E:
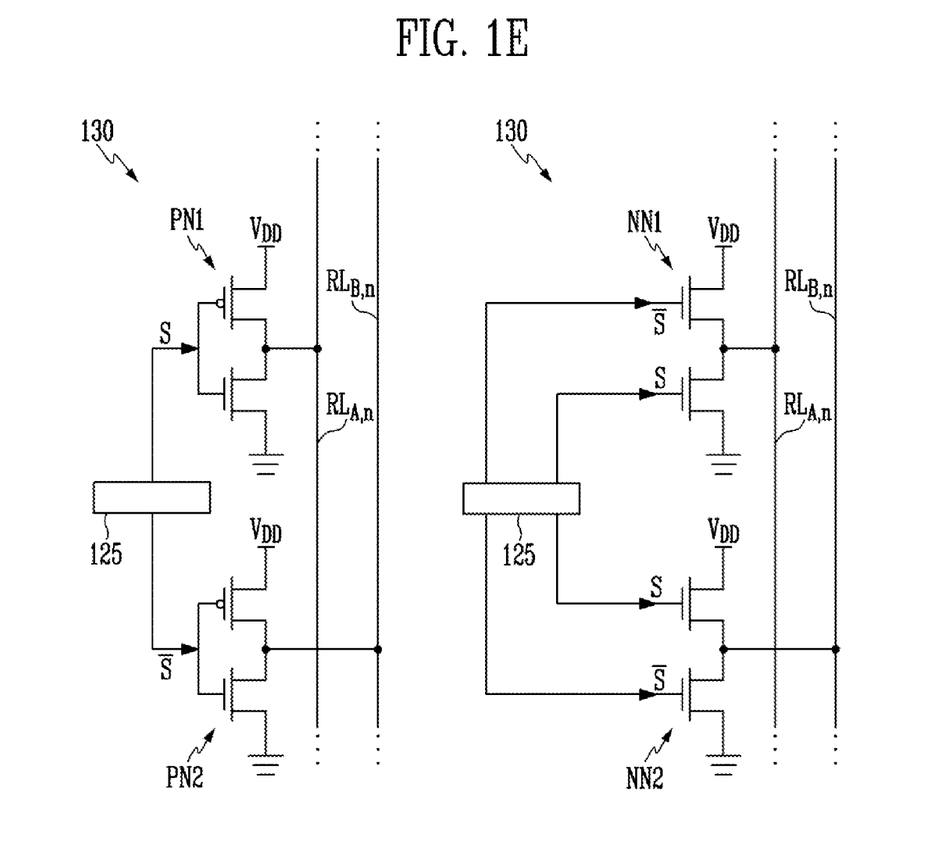
FIG. 1E shows a driving arrangement of the mask ROM device according to embodiments of the present invention.

This can be appreciated in FIG. 1D, which shows a circuit diagram of a subset of the memory cells of the mask ROM device 100 particularly, the memory cells $105_{1,2}$-$105_{1,4}$, $105_{2,2}$-$105_{2,4}$, $105_{(M-1),2}$-$105_{(M-2),4}$, $105_{M,2}$-$105_{M,4}$ in coupling states, and the respective logic value stored therein.

As can also be appreciated in FIG. 1D, in this embodiment no conductive current leakage between adjacent bit lines $BL_n$ is expected, whereby during the read operation the bit line selection circuit 115 may be configured to make each unselected bit line $BL_n$ either electrically floating or biased at the ground electric potential.

Figure 2A:
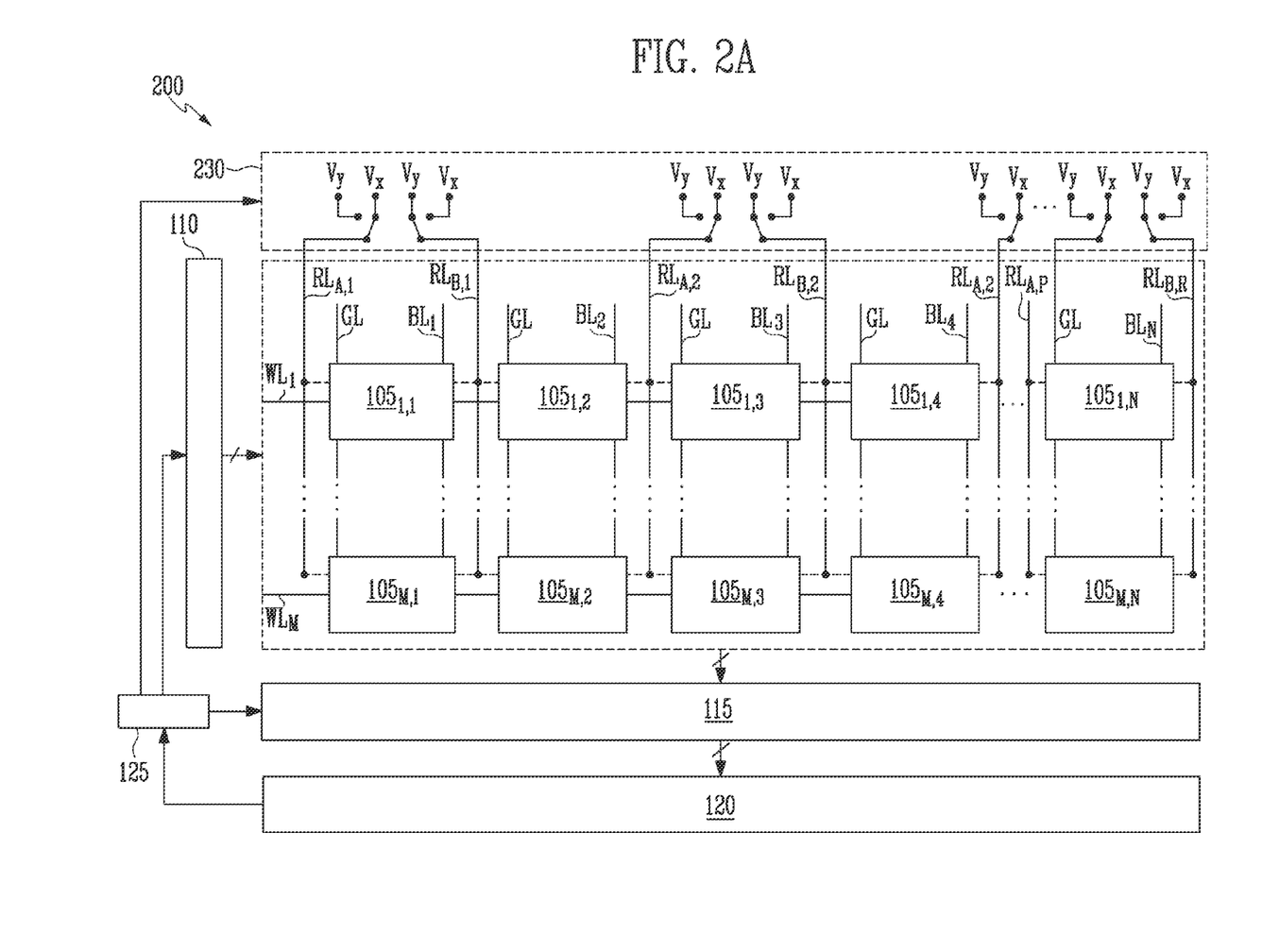
FIG. 2A schematically shows a mask ROM device according to another embodiment of the present invention.

FIG. 2A, which schematically shows a mask ROM device 200 according to another embodiment of the present invention, will be described below.

The mask ROM device 200 is analogous in structure to the mask ROM device 100, i.e. it comprises the plurality of memory cells $105_{m,n}$ arranged in M rows of memory cells (m=1, 2, . . . , M) and N columns of memory cells (n=1, 2, . . . , N), the plurality of word lines $WL_m$ each one associated with a corresponding row of memory cells, the plurality of bit lines $BL_n$ each one associated with a corresponding column of memory cells, the word line selection circuit 110 for selecting one or more word lines among the plurality of word lines $WL_m$ according to the row address, the bit line selection circuit 115 for selecting one or more bit lines among the plurality of bit lines $BL_n$ according to the column address, the reading circuit 120 for reading the logic value of the selected memory cell $105_{m,n}$, the control logic unit 125, and the ground lines GL fixedly providing the ground electric potential.

Similarly to the mask ROM device 100, the mask ROM device 200 comprises a plurality of reference lines $RL_{A,p}$ (p=1, 2, . . . P) each one selectively providing the low electric potential $V_x$, i.e., the low logic level, in the first read phase of the read operation and the high electric potential $V_y$, i.e., the high logic level, in the second read phase of the read operation, and a plurality of further reference lines $RL_{B,r}$ (r=1, 2, . . . R) each one selectively providing the high electric potential $V_y$, i.e., the high logic level, in the first read phase of the read operation and the low electric potential $V_x$, i.e., the low logic level, in the second read phase of the read operation.

Differently from the previous embodiment, in which a pair of reference lines $RL_{A,n}$, $RL_{B,n}$ is provided for each column of memory cells, in the embodiment of FIG. 2A one or more among the reference lines $RL_{A,p}$ and the reference lines $RL_{B,r}$ are shared by adjacent columns of memory cells.

According to an embodiment, as illustrated in FIG. 2A, each reference line $RL_{A,p}$ is provided between (shared by) a respective first pair of adjacent columns of memory cells, and each reference line $RL_{B,r}$ is provided between (shared by) a respective second pair of adjacent columns of memory cells different from and adjacent to the first pair of adjacent columns of memory cells or, otherwise stated, each column of memory cells shares the reference line $RL_{A,p}$ with one of the adjacent columns of memory cells, and shares the reference line $RL_{B,r}$ with the other one of the adjacent columns of memory cells.

In the illustrated embodiment, the column of memory cells $105_{1,1}$-$105_{M,1}$ and the column of memory cells $105_{1,2}$-$105_{M,2}$ represent an example of first pair of adjacent columns of memory cells, the column of memory cells $105_{1,3}$-$105_{M,3}$ and the column of memory cells $105_{1,4}$-$105_{M,4}$ represent another example of the first pair of adjacent columns of memory cells, and the column of memory cells $105_{1,2}$-$105_{M,2}$ and the column of memory cells $105_{1,3}$-$105_{M,3}$, represent an example of a second pair of adjacent columns of memory cells being adjacent to the first pairs of adjacent columns of memory cells.

Therefore, in the example at issue, the reference line $RL_{A,1}$ (p=1) is provided between (i.e., shared by) the column of memory cells $105_{1,1}$-$105_{M,1}$, and the reference line $RL_{B,1}$ (r=1) is provided between (i.e., shared by) the column of memory cells $105_{1,1}$-$105_{M,1}$ and the column of memory cells $105_{1,2}$-$105_{M,2}$. According to an embodiment, the reference line $RL_{B,2}$ (r=2) is provided between (i.e., shared by) the column of memory cells $105_{1,3}$-$105_{M,3}$ and the column of memory cells $105_{1,4}$-$105_{M,4}$, and the reference line $RL_{A,2}$ (p=2) is provided between (i.e., shared by) the column of memory cells $105_{1,2}$-$105_{M,2}$ and the column of memory cells $105_{1,3}$-$105_{M,3}$.

Due to such reference line sharing, a lower number of reference lines is provided, compared to the previously described embodiment, which reduces complexity and costs of the mask ROM device 200. In the considered example in which each column of memory cells shares the reference line $RL_{A,p}$ or the reference line $RL_{B,r}$ with an adjacent column of memory cells and, respectively, the reference line $RL_{B,r}$ or the reference line $RL_{A,p}$ with the other adjacent column of memory cells, when another adjacent column of memory cells is provided a number P=N/2+1 of reference lines $RL_{A,p}$ and a number R=N/2+1 of reference lines $RL_{B,r}$ may be provided.

Similarly to the mask ROM device 100, the mask ROM device 200 comprises a driving arrangement 230 for driving the reference lines $RL_{A,p}$, $RL_{B,r}$ with the low $V_x$ and high $V_y$ electric potentials.

The driving arrangement 230 is similar in structure to the driving arrangement 130.

Similarly to the driving arrangement 130, according to practical implementations, the driving arrangement 230 may comprise, for each reference line $RL_{A,p}$, $RL_{B,r}$, or for each group of reference lines $RL_{A,p}$, $RL_{B,r}$, a CMOS inverter (not shown), or other type of driver, powered between the power supply electric potential and the ground electric potential, and having an output terminal electrically coupled to the reference line $RL_{A,p}$, $RL_{B,r}$, or a NMOS-NMOS inverter (not shown), or other type of driver, powered between the power supply electric potential and the ground electric potential, and having an output terminal electrically coupled to the reference line $RL_{A,p}$, $RL_{B,r}$.

Due to the lower number of reference lines compared to the previous embodiment, the driving arrangement 230 may have, compared to the driving arrangement 130, a smaller size, practically, a lower number of drivers, which concurs to reduction in complexity, costs and power consumption of the mask ROM device 200.

Figure 2B:
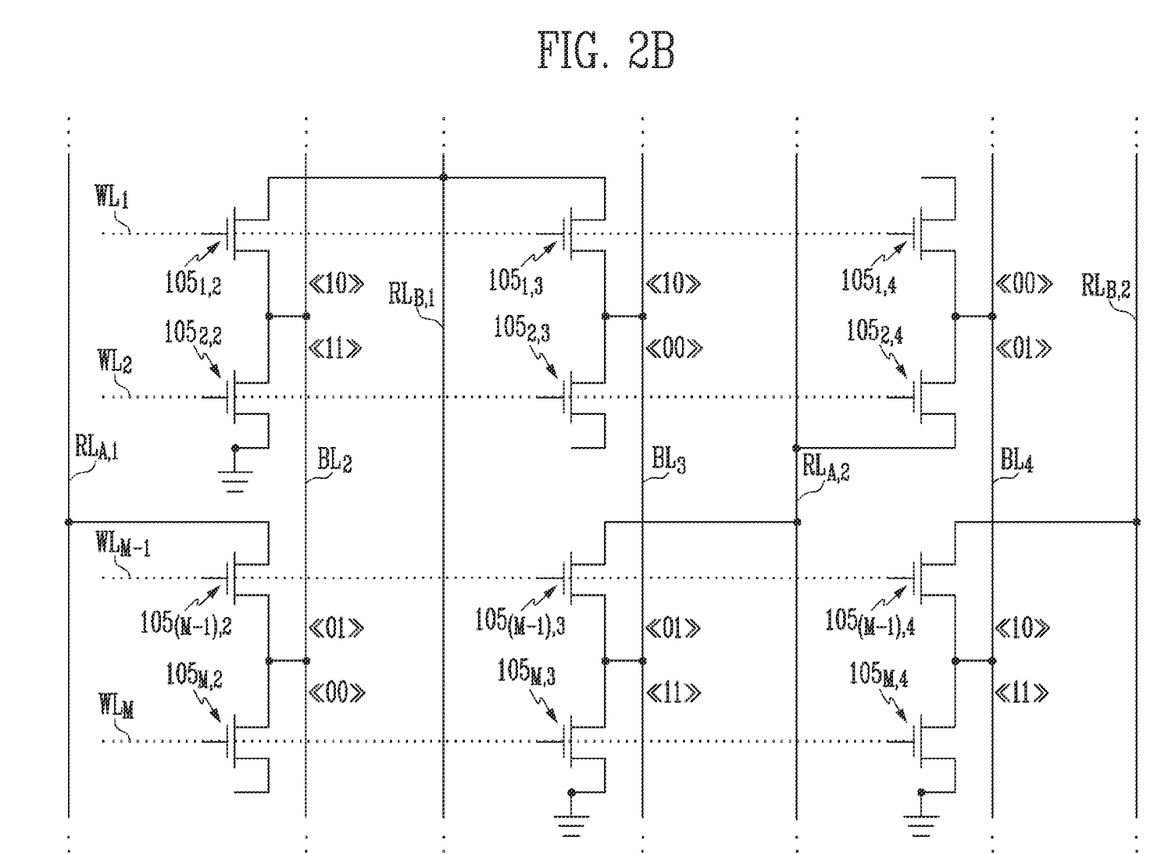
FIG. 2B shows a circuit diagram of a subset of the memory cells of the mask ROM device of FIG. 2A in coupling states, according to an embodiment of the present invention.

This can be appreciated in FIG. 2B, which shows a circuit diagram of a subset of the memory cells of the mask ROM device 200 (particularly, the memory cells $105_{1,2}$-$105_{1,4}$, $105_{2,2}$-$105_{2,4}$, $105_{(M-1),2}$-$105_{(M-2),4}$, $105_{M,2}$-$105_{M,4}$) in the same coupling states as FIG. 1D.

As can also be appreciated in FIG. 2B, in this embodiment conductive current leakages between adjacent bit lines $BL_n$ may arise: in the illustrated example, selection of the memory cell $105_{1,3}$, i.e., selection of word line $WL_1$ and of bit line $BL_3$, may determine an undesired conductive path to the unselected bit line $BL_2$ through the memory cell $105_{1,2}$ which is also associated with the same word line $WL_1$ as the memory cell $105_{1,3}$. In order to avoid these conductive current leakages, according to an embodiment, the bit line selection circuit 115 may be configured to make each unselected bit line $BL_n$ electrically floating during the read operation.

Figure 3A:
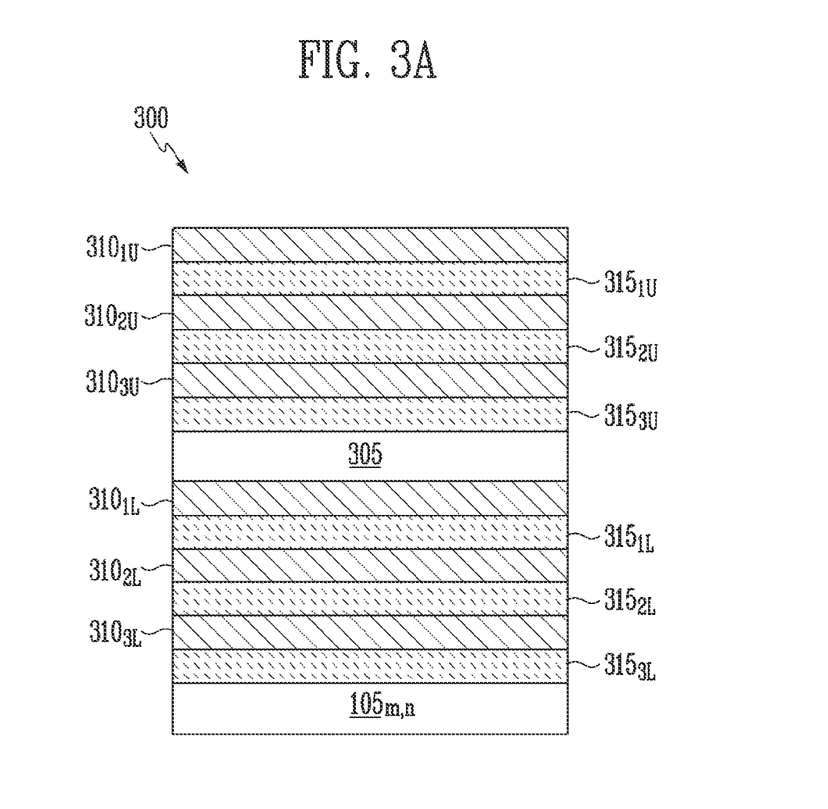
FIG. 3A shows a simplified sectional view of a memory system according to an embodiment of the present invention.
Figure 3B:
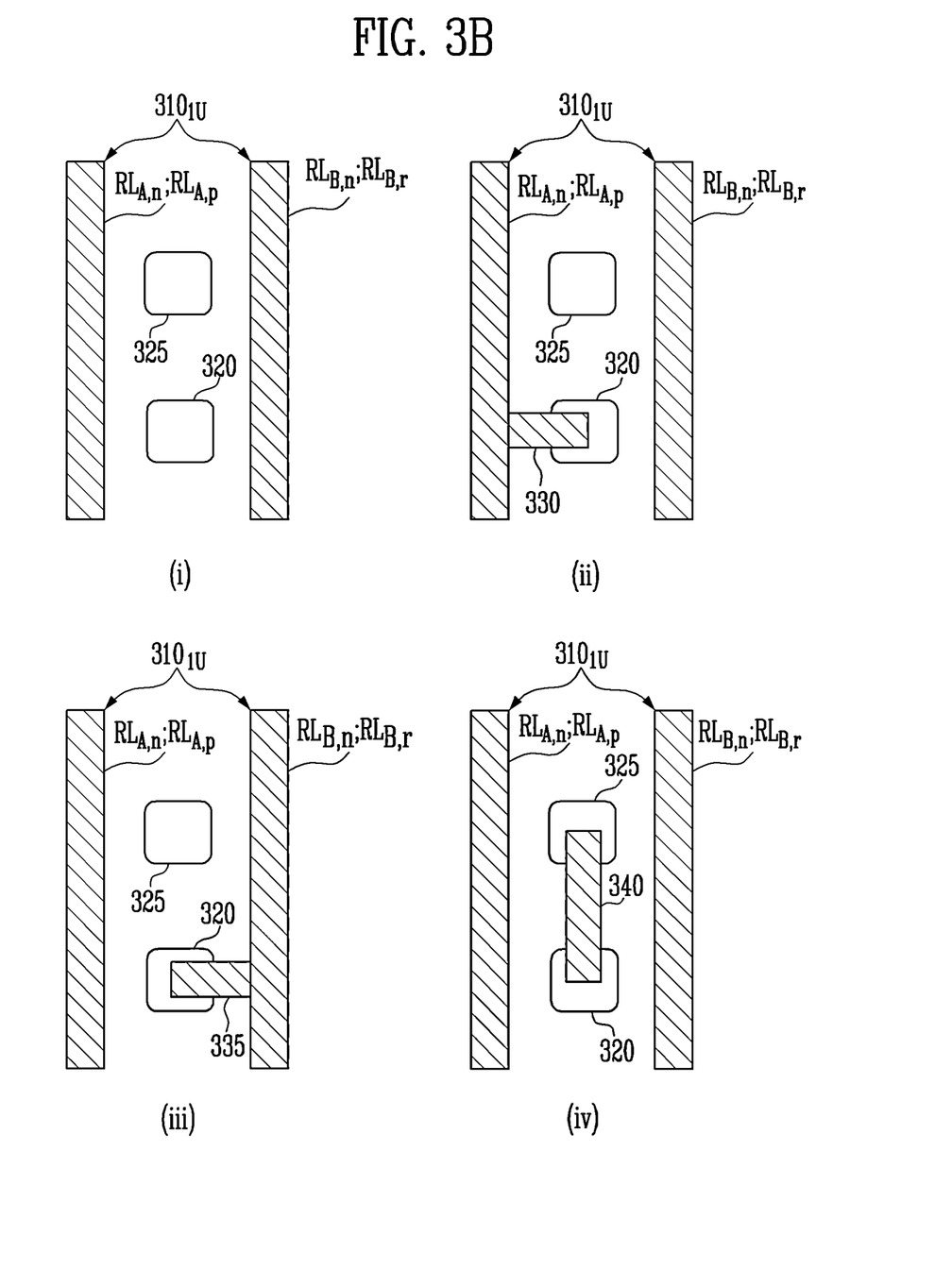
FIG. 3B shows a simplified plan view of the memory system of FIG. 3A in coupling states, according to an embodiment of the present invention.

With reference now to FIGS. 3A and 3B, FIG. 3A shows a simplified sectional view of a memory system 300, i.e., a portion thereof, according to an embodiment of the present invention, and FIG. 3B shows a simplified plan view of the memory system 300, i.e., of a portion thereof, in the coupling states (i)-(iv).

According to an embodiment, the memory system 300 is a semiconductor integrated system such as, a "Large Scale Integration" (LSI) system or a "Very Large Scale Integration" system, formed on a single semiconductor chip.

According to an embodiment, the memory system 300 comprises the mask ROM device 100 or the mask ROM device 200 hereinafter concisely referred to as mask ROM device 100,200.

According to an embodiment, the memory system 300 comprises a tridimensional NAND flash memory device. According to an embodiment, the memory cells of the mask ROM device 100, 200 form a "Periphery Under Cell" (PUC) structure of the tridimensional NAND flash memory device, i.e. with tridimensional NAND flash memory cells 305 of the tridimensional NAND flash memory device that are formed above the memory cells $105_{m,n}$ of the mask ROM device 100,200.

According to an embodiment, as typical in modern semiconductor integrated systems, the memory system 300 comprises multiple levels of metal interconnects (metal layers) mutually separated from each other by respective dielectric layers.

According to an embodiment, the metal layers comprise metal layers formed above the NAND flash memory cells 305 hereinafter, upper metal layers, mutually separated from each other by respective dielectric layers hereinafter, upper dielectric layers.

Three upper metal layers 31010, 31020, 3103u and three upper dielectric layers $315_{1U}$, $315_{2U}$, $315_{3U}$ are by way of example shown in FIG. 3A, although this should not be construed limitatively.

According to an embodiment, the metal layers comprise metal layers formed (above the memory cells $105_{m,n}$, below the NAND flash memory cells 305 hereinafter, lower metal layers, mutually separated from each other by respective dielectric layers hereinafter, lower dielectric layers.

Three lower metal layers $310_{1L}$, $310_{2L}$, $310_{3L}$ and three lower dielectric layers $315_{1L}$, $315_{2L}$, $315_{3L}$ are by way of example shown in FIG. 3A, although this should not be construed limitatively.

According to an embodiment, the lower metal layers $310_{1L}$, $310_{2L}$, $310_{3L}$ or at least a subset thereof, are the layers from which disturb-sensitive lines are formed. According to an embodiment, the lower metal layers $310_{1L}$, $310_{2L}$, $310_{3L}$ or at least a subset thereof, are the layers from which the bit lines of the memory system including the bit lines $BL_n$ of the mask ROM device 100, 200, and/or the ground lines of the memory system including the ground lines GL of the mask ROM device 100,200, and/or the word lines of the memory system including the word lines $WL_m$ of the mask ROM device 100, 200 are formed.

According to an embodiment, the upper metal layers $310_{1U}$, $310_{2U}$, $310_{3U}$ or at least a subset thereof, are the layers from which disturbing lines are formed, e.g., so as to separate them from the disturb-sensitive lines provided in the lower metal layers $310_{1L}$, $310_{2L}$, $310_{3L}$. According to an embodiment, the upper metal layers $310_{1U}$, $310_{2U}$, $310_{3U}$ or at least a subset thereof, are the layers from which power supply lines and clock distribution lines are formed.

According to an embodiment, the upper metal layers $310_{1U}$, $310_{2U}$, $310_{3U}$ or at least a subset thereof, are the layers from which the reference lines of the mask ROM device 100,200 (i.e., the reference lines $RL_{A,n}$, $RL_{B,n}$ of the mask ROM device 100, or the reference lines $RL_{A,p}$, $RL_{B,r}$ of the mask ROM device 200, or a subset thereof), are formed. According to an embodiment, the reference lines of the mask ROM device 100,200, i.e., the reference lines $RL_{A,n}$, $RL_{B,n}$ of the mask ROM device 100, or the reference lines $RL_{A,p}$, $RL_{B,r}$ of the mask ROM device 200, or a subset thereof, are formed from the uppermost metal layer of the memory system 300, i.e., the uppermost metal layer of the upper metal layers, namely the metal layer 3101u in the example at issue.

Forming the reference lines of the mask ROM device 100,200 from the upper metal layers and, particularly, from the uppermost metal layer of the memory system 300 does not significantly affect power consumption: indeed, upper metal layers exhibit low or relatively low resistances, which results in narrow or relatively narrow, and low or relatively low capacitance lines.

Just as an example, for the mask ROM device 200, the additional electric charge required to charge the reference lines $RL_{A,p}$, $RL_{B,r}$ at the power supply electric potential VD is comparable to the electric charge saved by bit line length reduction.

According to an embodiment, as is typical in modern semiconductor integrated systems, the memory system 300 comprises plurality of electrical connects, e.g., contacts and/or vias, to make vertical connects between interconnects on different levels. Two contacts are shown in FIG. 3B, namely a source contact 320 electrically connected to a respective source terminal of the memory cells $105_{m,n}$, and a ground contact 325 connected to a respective ground line.

As visible in FIG. 3B, the source terminal of each MOS transistor of each memory cell is electrically floating (coupling state (i)), or it is electrically coupled to one among a respective reference line $RL_{A,n}$, $RL_{A,p}$ (coupling state (ii)), a respective reference line $RL_{B,n}$, $RL_{B,r}$ (coupling state (iii)), and a respective ground line (coupling state (iv)) by means of a respective electric coupling formed from the uppermost metal layer. Particularly, as is visible in FIG. 3B, the electric coupling 330 between the source contact 320 and the reference line $RL_{A,n}$, $RL_{A,p}$ implements the coupling state (ii), the electric coupling 335 between the source contact 320 and the reference line $RL_{B,n}$, $RL_{B,r}$ implements the coupling state (iii), and the electric coupling 340 between the source contact 320 and the ground contact 325 implements the coupling state (iv).

Forming the electric couplings 330-340 and, hence, the programming of the memory cells $105_{m,n}$ in the uppermost metal layer allows changing the programming of the mask ROM device 100,200 in the later second half of the manufacturing process of the memory system 300: this provides an increased degree of design choice, which is effective in cost reduction. Moreover, forming the electric couplings 330-340 and, hence, the programming of the memory cells $105_{m,n}$ by means of the uppermost metal layer avoids manufacturing additional, dedicated electrical connects throughout the memory system which could otherwise pose limiting layout constraints.

Figure 4:
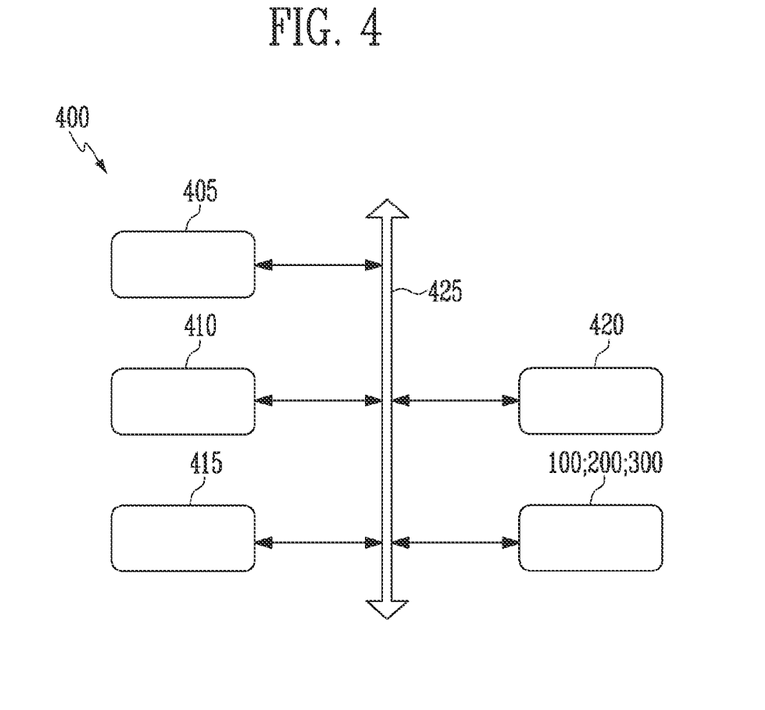
FIG. 4 shows a simplified block diagram of an electronic apparatus according to an embodiment of the present invention.

FIG. 4 shows a simplified block diagram of an electronic apparatus according to an embodiment of the present invention.

According to an embodiment, the electronic apparatus 400 comprises a memory. The memory may comprise the mask ROM device 100 or more thereof, the mask ROM device 200 or more thereof, or the memory system 300.

According to an embodiment, the electronic apparatus 400 may comprise a controller 405 for example, one or more microprocessors and/or one or more microcontrollers.

According to an embodiment, the electronic apparatus 400 may comprise an input/output device 410, such as a screen and/or a keyboard.

According to an embodiment, the electronic apparatus 400 may comprise a wireless interface 415, e.g., one or more antennas and/or one or more wireless transceivers for wirelessly exchanging messages with a wireless communication network (not shown).

According to an embodiment, the electronic apparatus 400 may comprise a power supply device 420 for example, a battery, for powering the electronic apparatus 400.

According to an embodiment, the electronic apparatus 400 may comprise one or more communication channels (bus) 425 to allow the exchange of data between the memory, the controller 405 (when provided), the input/output device 410 (when provided), the wireless interface 415 (when provided), and the power supply device 420 (when provided).

In order to satisfy local and specific requirements, a person skilled in the art may apply to the invention described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

In particular, similar considerations apply if the mask ROM device has a different structure or comprises equivalent components. In any case, any component thereof may be separated into several elements, or two or more components may be combined into a single element; furthermore, each component can be replicated to support the execution of the corresponding operations in parallel. It should also be noted that, unless otherwise indicated, any interaction between different components generally does not need to be continuous, and may be either direct or indirect through one or more intermediaries.

Although specific terminologies are used herein, they are used only to describe the embodiments of the present disclosure. The present invention is not restricted by any such terminology nor any particular details, as many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:

1. A mask read only memory device comprising:
    a plurality of single-transistor memory cells arranged in rows of memory cells and columns of memory cells;
    a plurality of word lines each one associated with a corresponding row of memory cells of the plurality of memory cells;
    a plurality of bit lines each one associated with a corresponding column of memory cells of the plurality of memory cells;
    a ground line fixedly providing a ground electric potential;
    a plurality of first reference lines each one selectively providing a first reference electric potential in a first read phase of a read operation, and a second reference electric potential higher than the first reference electric potential in a second read phase of the read operation; and
    a plurality of second reference lines each one selectively providing the second reference electric potential in the first read phase and the first reference electric potential in the second read phase,
    wherein each memory cell comprises a metal-oxide semiconductor (MOS) transistor having a gate terminal electrically coupled to a respective word line, a drain terminal electrically coupled to a respective bit line, and a source terminal, the source terminal being either electrically floating or electrically coupled to one among a respective first reference line, a respective second reference line and the ground line, whereby a first logic value, a second logic value, a third logic value or a fourth logic value is respectively read during the read operation of that memory cell, and
    wherein each first reference line is shared by a respective first pair of adjacent columns of memory cells, and each second reference line is shared by a respective second pair of adjacent columns of memory cells different from and adjacent to the first pair of adjacent columns of memory cells.

2. The mask read only memory device of claim 1, wherein at least one reference line among the plurality of first reference lines and the plurality of second reference lines is shared by adjacent columns of memory cells.

3. The mask read only memory device of claim 2, further comprising a bit line selection circuit for selecting bit lines associated with memory cells to be read during the read operation, the bit line selection circuit being configured to make each unselected bit line electrically floating during the read operation.

4. The mask read only memory device of claim 1, wherein the plurality of first reference lines and the plurality of second reference lines comprise a pair of a first reference line and a second reference line for each column of memory cells.

5. The mask read only memory device of claim 1, further comprising a driving arrangement for driving the plurality of first reference lines and the plurality of second reference lines with the first and second reference electric potentials, the driving arrangement comprising a complementary metal-oxide semiconductor (CMOS) inverter or a N-type metal-oxide semiconductor (NMOS) inverter.

6. The mask read only memory device of claim 1, wherein the first reference electric potential is the ground electric potential.

7. A memory system including a mask read only memory device, the mask read only memory device comprising:
    a plurality of single-transistor memory cells arranged in rows of memory cells and columns of memory cells;
    a plurality of word lines each one associated with a corresponding row of memory cells of the plurality of memory cells;
    a plurality of bit lines each one associated with a corresponding column of memory cells of the plurality of memory cells;
    a ground line fixedly providing a ground electric potential;
    a plurality of first reference lines each one selectively providing a first reference electric potential in a first read phase of a read operation, and a second reference electric potential higher than the first reference electric potential in a second read phase of the read operation; and
    a plurality of second reference lines each one selectively providing the second reference electric potential in the first read phase and the first reference electric potential in the second read phase,
    wherein each memory cell comprises a metal-oxide semiconductor (MOS) transistor having a gate terminal electrically coupled to a respective word line, a drain terminal electrically coupled to a respective bit line, and a source terminal, the source terminal being either electrically floating or electrically coupled to one among a respective first reference line, a respective second reference line and the ground line, whereby a first logic value, a second logic value, a third logic value or a fourth logic value is respectively read during the read operation of that memory cell, and
    wherein the memory system comprises a tridimensional NAND flash memory device, the plurality of memory cells of the mask read only memory device forming a periphery under cell structure of the tridimensional NAND flash memory device.

8. The memory system of claim 7, wherein at least one of the first and second reference lines is formed from an uppermost metal layer of the memory system.

9. The memory system of claim 8, wherein the source terminal of each MOS transistor is electrically coupled to one among the first reference line, the second reference line and the ground line by means of a respective electric coupling formed from the uppermost metal layer of the memory system.

* * * * *